(12) United States Patent
Akagawa

(10) Patent No.: US 7,579,120 B2
(45) Date of Patent: Aug. 25, 2009

(54) SUBSTRATE FOR RETICLE AND METHOD OF MANUFACTURING THE SUBSTRATE, AND MASK BLANK AND METHOD OF MANUFACTURING THE MASK BLANK

(75) Inventor: Hiroyuki Akagawa, Tokyo (JP)

(73) Assignee: Hoya Corporation, Tokyo (JP)

( * ) Notice: Subject to any disclaimer, the term of this patent is extended or adjusted under 35 U.S.C. 154(b) by 672 days.

(21) Appl. No.: 10/549,901

(22) PCT Filed: Mar. 18, 2004

(86) PCT No.: PCT/JP2004/003617

§ 371 (c)(1), (2), (4) Date: Sep. 20, 2005

(87) PCT Pub. No.: WO2004/083961

PCT Pub. Date: Sep. 30, 2004

(65) Prior Publication Data
US 2006/0223224 A1    Oct. 5, 2006

(30) Foreign Application Priority Data
Mar. 20, 2003    (JP)    ............... 2003-077005

(51) Int. Cl.
*G03F 1/00* (2006.01)
(52) U.S. Cl. ............... 430/5; 430/11; 451/41
(58) Field of Classification Search ............ 430/5
See application file for complete search history.

(56) References Cited

U.S. PATENT DOCUMENTS

2002/0058186 A1    5/2002  Nozawa et al.
2002/0061452 A1*   5/2002  Nozawa et al. ............ 430/5
2002/0155361 A1*  10/2002  Takeuchi et al. .......... 430/5
2003/0031890 A1*   2/2003  Moriya et al. ........... 428/620
2003/0036340 A1*   2/2003  Moriya et al. ........... 451/41
2003/0186624 A1*  10/2003  Koike et al. ............. 451/8

FOREIGN PATENT DOCUMENTS

DE    10314212 A1    3/2003
EP    1152291 A2    11/2001
EP    1283551 A2    2/2003
JP    64-40267 A    2/1989

(Continued)

OTHER PUBLICATIONS

German Office Action dated, Jun. 20, 2008.

(Continued)

*Primary Examiner*—Mark F Huff
*Assistant Examiner*—Stewart A Fraser
(74) *Attorney, Agent, or Firm*—Sughrue Mion, PLLC (57) ABSTRACT

In a reticle substrate is used for forming a reticle held on a stepper and has main surfaces opposing each other, side faces, and chamfered surfaces formed between main surfaces and side faces, a flatness-measuring area is defined as an area excluding a peripheral area of a width of 3 mm inwardly laid from a boundary between the main surface and the chamfered surfaces and has a flatness of 0.5 μm or less, and a maximum height from a reference plane falls between −1 and 0 μm at the boundary between the main surface and the chamfered surface.

20 Claims, 3 Drawing Sheets

FOREIGN PATENT DOCUMENTS

| | | |
|---|---|---|
| JP | 2002-162726 A | 6/2002 |
| JP | 2002-318450 A | 10/2002 |
| JP | 2003-51472 A | 2/2003 |
| JP | 2003315980 A | 11/2003 |
| JP | 2004-29735 A | 1/2004 |
| JP | 2004-54285 A | 2/2004 |

OTHER PUBLICATIONS

Masamitsu Itoh, et al., New Concept of Specification for Mask Flatness, Proceedings of SPIE Photomask and Next-Generation Lithography Mask Techonology IX, SPIE vol. 4754 (2002), 43-53.

* cited by examiner

SUBSTRATE FOR RETICLE AND METHOD OF MANUFACTURING THE SUBSTRATE, AND MASK BLANK AND METHOD OF MANUFACTURING THE MASK BLANK

TECHNICAL FIELD

The present invention relates to substrates for reticles and relates to methods for manufacturing the substrates. The reticles are mounted onto steppers used in manufacturing semiconductor integrated circuits and are used as masks for reduced projection exposure apparatuses. The present invention also relates to mask blanks and relates to methods for manufacturing the mask blanks.

BACKGROUND ART

A reticle is mounted onto a stepper for the transfer of a pattern and used as a mask for a reduced projection exposure apparatus in manufacturing of semiconductor integrated circuits. For example, the reticle has a pattern of a light-shielding film of chromium or the like formed by sputtering, on a transparent glass substrate having at least a main surface mirror-finished.

Nowadays, as miniaturization of patterns progresses, the reticle substrate has been required to have a high flatness and high smoothness.

Recently, the reticle substrate is required to form a pattern with a high accuracy in position of the pattern in an area for the transfer of the pattern. For example, a substrate with 6025 size (6×6×0.25 inches) (1 inch=25.4 mm) is required to have a flatness of 0.5 µm or less (the semiconductor design rule: 100 nm), more preferably, a flatness of 0.25 µm or less (semiconductor design rule: 70 nm) at an area (referred to as a flatness-measuring area, hereinafter) of a main surface of the substrate excluding a peripheral area having a width of 3 mm from an edge or a boundary between the main surface and a chamfered surface. The flatness is defined by a difference in height between the maximum and minimum values of a measuring face, relative to a virtual absolute plane (focal plane) calculated by least-squares method from the measuring face of the substrate surface.

As described above, in the past, requirement of flatness has been directed only to an area except a certain width from the side face of the substrate, i.e. only the central part of the substrate.

However, as miniaturization of patterns progresses, a line width of a pattern has been recently reduced. Therefore, a peripheral configuration of the reticle substrate simply affects the pattern position accuracy when a pattern on the reticle is transferred to a patterning substrate by using a stepper.

Namely, the reticle is generally attached to the stepper so that a main surface having the pattern faces a substrate on which the pattern is transferred. On this occasion, the reticle is fixed so as to secure a broad patterning area and to prevent misalignment of the substrate in the operation of the stepper by vacuum chucking of the periphery outside the flatness-measuring area or the periphery spanning the flatness-measuring area and the area other than the flatness-measuring area of the main surface of the substrate.

Figure 2:
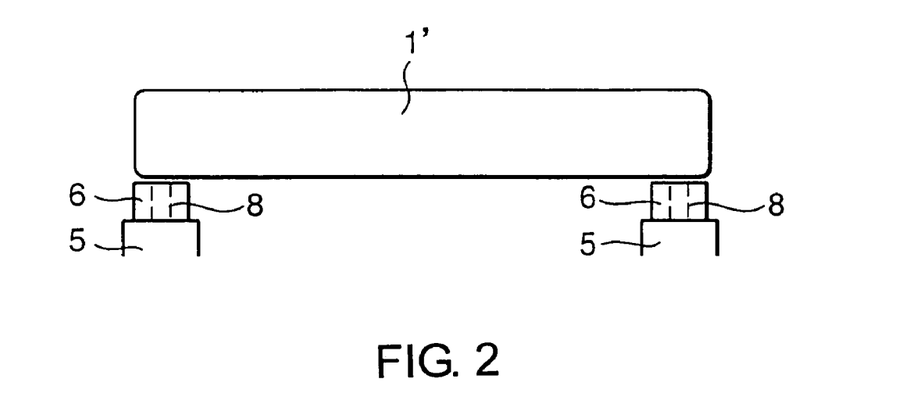
FIG. 2 is a diagram showing a mechanism of a stepper for fixing the substrate.

FIG. 2 shows a mechanism of attachment of the reticle to the stepper.

With reference to FIG. 2, a reticle 1' is attached to substrate-holding members 6, and is set to a substrate-holding unit 5. The substrate-holding members 6 are disposed along two edges of the reticle 1' and are connected to a vacuum unit (not shown). The reticle 1' is held by suction of the vacuum unit.

On this occasion, if the end shape (flatness, edge flagging, etc.) at the peripheries of the substrate (reticle substrate) constituting a base material of the reticle is improper, the substrate is deformed by vacuum chucking. Therefore, various problems take place in connection with pattern position accuracy in the transferred pattern, i.e. a displacement in distances between the transferred patterns and deterioration of uniformity of line width.

The above-mentioned problems are indicated in Proceedings of SPIE Photomask and Next-Generation Lithography Mask Technology IX, Vol. 4754, 43-53 (2002). Herein, if the edge of the reticle substrate curves upward, the position accuracy decreases when the substrate is held by the stepper The document suggests that the edge of the reticle substrate is preferably flat or has a little edge flagging.

The area of the main surface of the substrate supported by the substrate-holding members 6 is varied at every one of stepper makers. The amount of deformation of the substrate due to the vacuum chucking varies depending on this difference. Therefore, it is necessary that a reticle substrate designed so that the amount of the substrate deformation due to the vacuum chucking is controlled within a predetermined value regardless of the substrate-holding members of the stepper apparatuses. However, it is difficult to actually responding to this. Consequently, the amount of the substrate deformation due to the vacuum chucking must be controlled within a predetermined value, regardless of the areas supported by the substrate-holding members. Such designed reticle substrate is necessary, but the document does not disclose this point.

In general, the reticle substrate is manufactured by precise polishing disclosed in Japanese Unexamined Patent Application Publication (JP-A) No. 1-40267.

In the precision polishing, both sides of a plurality of reticle substrates are polished at the same time, the so-called double-side polishing in batch is performed in multistage. The substrates are polished with an abrasive containing cerium oxide as the main ingredient, and then are polished with an abrasive containing colloidal silica as the main ingredient for the finishing. In the precision polishing, a suede-type polishing pad is used for smoothing the main surface of the substrates.

In the above-mentioned method, a high productivity is achieved, however, an excessive pressure is applied to the peripheries of the reticle substrate from the polishing pad. Therefore, the polishing pad sinks and instability in the shape of the polishing pad occurs during the polishing process. Thus, the reticle substrate having a high flatness cannot be obtained. In particular, since the end shape of the reticle substrate becomes improper, the substrate cannot be reliably attached to the substrate-holding means of the stepper. When the pattern on the reticle is transferred to a patterning substrate by using the stepper, the accuracy of pattern position is decreased. As mentioned above, some problems exist.

Consequently, in Japanese Unexamined Patent Application Publication (JP-A) No. 2002-318450, proposal has been made about a method for manufacturing a glass substrate for a photomask. In the method, the glass substrate has a shape so as to have a flat face when the surface of the glass substrate is provided with a patterning of a light-shielding film. So, the exposure of the glass substrate can be performed to the flat face. Such a glass substrate is prepared by partial plasma etching depending on a difference calculated according to shapes of the glass substrate and a glass substrate as a raw material.

In the above-mentioned method, the exposed face of the glass substrate theoretically becomes flat during the exposure. However, since the face roughness and a work-affected layer due to plasma etching occur on the surface of the glass substrate, mechanical polishing must be performed within a very short time. Disadvantageously, a decrease in flatness due to mechanical polishing for the very short time cannot be neglected, and the additional processes reduce the productivity.

The peripheries of the substrate cannot be precisely measured by the method (flatness measurement by optical interference method) for measuring the shape of the substrate disclosed in Japanese Unexamined Patent Application Publication (JP-A) No. 2002-318450. Therefore, even if a desirable flat face is formed, the shape of the substrate peripheries cannot be actually formed. The reticle is deformed when the reticle is attached to the substrate-holding means of the stepper, and the accuracy in position of the transferred pattern is problematically decreased.

Japanese Unexamined Patent Application Publication (JP-A) No. 2003-51472 discloses a substrate having a flatness of 0.5 μm or less at the peripheral area having a width of 3 mm inward from the edges of the end faces of the substrate. The purposes of this is to prevent a decrease in test sensitivity and to prevent a decrease in accuracy of the face to which resist is applied. Namely, the above-mentioned Japanese Unexamined Patent Application Publication (JP-A) No. 2003-51472 discloses only flatness at the peripheral area of the substrate and does not cite problems when a thin film is formed on the substrate. Japanese Unexamined Patent Application Publication (JP-A) No. 2003-51472 does not refer to the flatness of areas other than the peripheral area of the substrate.

Therefore, if the reticle is configured by forming a thin film on the substrate defined by Japanese Unexamined Patent Application Publication (JP-A) No. 2003-51472, a large film stress is applied to the thin film to deform the shape of the reticle. Furthermore, since the reliability of the flatness value measured at an area near the peripheral area of the substrate is low, deformation of the reticle cannot be sufficiently prevented when the substrate-holding means of steppers are different by the manufacturers.

DISCLOSURE OF INVENTION

The present invention has been achieved in view of the above-mentioned problems, and provides a reticle substrate and a mask blank which can prevent deformation in a reticle prepared by forming a thin film formed on the substrate. Namely, it is an object of the present invention to provide the reticle substrate and a method for manufacturing the substrate with a high productivity and at a high yield rate. The reticle substrate can control the deformation of the reticle and minimize a decrease in precision of a position of a transferred pattern, even if steppers have their respective substrate-holding members different in shape and the reticle is mounted on any one of the various shapes of the substrate-holding members which abut against the respective areas of the substrate.

Furthermore, it is an object of the present invention to provide the mask blank and a method for manufacturing the mask blank with a high productivity and at a high yield rate. The mask blank can control the deformation of the reticle and minimize a decrease in precision of a position of a transferred pattern, even if steppers have their respective substrate-holding members different in shape and the reticle is mounted on any one of the various shapes of the substrate-holding members which abut against the respective areas of the substrate.

(Aspect 1) A reticle substrate comprising a pair of main surfaces opposing each other, two pairs of side faces that are right to the main surfaces and that are opposed in pair to each other, and chamfered surfaces between the main surfaces and the side faces, wherein:

a flatness is not greater than 0.5 μm on a flatness measurement area of each main surface, from which an area of 3 mm laid inwardly from a boundary between the main surface and the chamfered surface is excluded, while the boundary between the main surface and the chamfered surface has a maximum height between −1 and 0 μm from a reference surface.

(Aspect 2) A mask blank comprising a thin film for a transfer pattern, on a main surface of the reticle substrate according to the aspect 1.

(Aspect 3) The mask blank according to the aspect 2, wherein the thin film has a film stress of 0.5 Gpa or less.

(Aspect 4) The mask blank according to aspect 2 or 3, wherein the flatness is not greater than 0.5 μm on a flatness measurement area of the main surface on which the thin film is formed, with an area of 3 mm which is laid inwardly from the boundary between the main surface and the chamfered surface exempted from the flatness measurement area, while the boundary between the main surface and the chamfered surface has the maximum height between −1 and 0 μm from the reference surface.

(Aspect 5) A method for manufacturing the reticle substrate according to claim 1, characterized by the steps of grinding and precisely polishing a main surface of a reticle substrate; thereafter measuring a surface configuration of the main surface on an area that includes a substrate peripheral portion supported by a substrate-holding member of an exposure apparatus; and modifying the surface configuration of the main surface on the basis of a result of the measurement so that the surface configuration of the main surface becomes a desired shape, by finding that an area of the main surface is convex relative to an optionally determined reference plane, by providing, on the area, a pressure higher than the other areas onto polishing pads of a polishing apparatus, with a polishing liquid being supplied towards the polishing pads, and by moving the reticle substrate relative to the polishing pads.

(Aspect 6) The method for manufacturing the reticle substrate according to aspect 5, wherein the above-mentioned precisely polishing step comprises a roughly polishing process of removing surface defects of the substrate while maintaining the flatness obtained in the grinding process by using a relatively large abrasive grain; and a mirror-polishing process of polishing the surface of the substrate for mirror finish by using a relatively small abrasive grain.

(Aspect 7) A method for manufacturing the mask blank by forming a thin film as a transfer pattern on a main surface of the reticle substrate manufactured by the method according to aspect 5 or 6.

(Aspect 8) The method for manufacturing the mask blank according to aspect 7, comprising a heating process of suppressing that change of the maximum height from the reference plane which appears during or after the forming of the thin film, at the boundary between the main surface and the chamfered surface, the heating process being carried out before and after the forming of the thin film.

According to the above-mentioned aspect 1, the substrate has a flatness of 0.5 μm or less at a flatness-measuring area defined as an area of the main surface of the substrate excluding a peripheral area of a width of 3 mm inward from the boundary between the main surface and the chamfered surfaces and the maximum height of −1 to 0 μm from a reference plane at the boundary between the main surface and the chamfered surface. Therefore, deformation of the reticle can be controlled and a decrease in precision of a position of a transferred pattern can be minimized, even if steppers have their respective substrate-holding members different in shape and the reticle is mounted on any one of the various shapes of the substrate-holding members which abut against the respective areas of the substrate.

The flatness in the present invention is a value indicating warpage of the substrate surface and is shown by Total Indicated Reading (TIR). The flatness is a difference in height from a reference plane which is arbitrarily determined at the side of the front main surface of the substrate between the maximum point and the minimum point of a surface shape in the main surface (a difference in height between the maximum point and minimum point of a measuring face against a virtual absolute plane (focal plane) calculated by least-squares method from the measuring face).

The flatness can be measured by utilizing optical interference. The optical interference method utilizes that a difference in height of a surface of the substrate can be observed as a phase shift of a reflected light when the surface is irradiated with a coherent light such as a laser. In such a method, since the flatness cannot be precisely measured at an area of a width of 3 mm inward from the boundary between the main surface and the chamfered surfaces of the substrate, the resulting flatness of this area is low in reliability. Therefore, this area is excluded from the flatness-measuring area.

The flatness at the flatness-measuring area is preferably 0.5 μm or less, more preferably 0.25 μm or less, and most preferably 0.05 μm or less.

The substrates having the same flatness at the flatness-measuring area can have different end shapes, i.e. flat toward the chamfered surfaces, curving downward (flagging-end or roll-off type) toward the chamfered surfaces, or curving upward (ski-jump type) toward the chamfered surfaces.

When the reticle is held to the substrate-holding member of a stepper of an exposure apparatus by vacuum chucking, the vacuum chucking of the periphery of the substrate causes deformation of the substrate. Therefore, the flat end or the flagging end (roll-off type) is more preferable than the end curving upward (ski-jump type).

In the present invention, the above-mentioned end shape is evaluated by the maximum height from a reference plane at the boundary between the main surface and the chamfered surface to quantify a degree of curving downward or upward.

Figure 3:
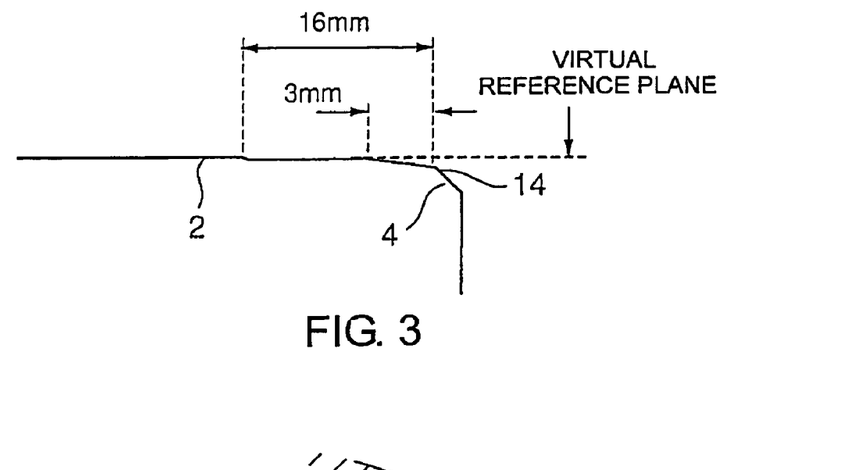
FIG. 3 is a diagram showing a shape of a periphery of the reticle substrate according to the present invention.

The reference plane is appropriately adjusted based on the substrate size. For example, as shown in FIG. 3, the boundary or edge 14 between the main surface 2 and the chamfered surface 4 is defined as a reference position. A plane or a line determined by connecting a point of 3 mm inward from this reference position to a point of 16 mm toward the center from this reference point is defined as a virtual reference plane or a virtual reference line. When the virtual reference plane (or virtual reference line) is assumed to have a height of 0, the degree of curving upward or downward is defined by the maximum height at the boundary between the main surface and the chamfered surface. The maximum height is 0 when the end shape is flat. The maximum height is minus (−) when the peripheral area of the main surface of the substrate curves downward (flagging end or roll-off type). The maximum height is plus (+) when the peripheral area of the main surface of the substrate curves upward (ski-jump type).

According to the present invention, the maximum height is between −1 μm and 0 μm. When the maximum height exceeds 0 μm, the periphery curves upward. Consequently, deformation of the reticle increases when the reticle is mounted on the substrate-holding means of the stepper. This causes a decrease in precision of the position of a transferred pattern.

On the other hand, when the maximum height is less than −1 μm, the substrate-holding member of the stepper cannot tightly hold the reticle. Consequently, the holding is unstable. This causes a decrease in precision of the position of a transferred pattern, which is undesirable. As miniaturization of a pattern progresses, the precision of the position of the pattern has been required to be high. Therefore, the maximum height is preferably between −0.5 μm and 0 μm, more preferably between −0.25 μm and 0 μm, more preferably between −0.1 μm and 0 μm, and most preferably between −0.05 μm and 0 μm.

A combination of the flatness at the flatness-measuring area and the maximum height from a reference plane at the boundary between the main surface and the chamfered surface is preferably a flatness of 0.25 μm or less and the maximum height of −0.5 to 0 μm, more preferably −0.25 to 0 μm, from a reference plane at the boundary between the main surface and the chamfered surface, and is more preferably a flatness of 0.05 μm or less and the maximum height of −0.1 to 0 μm, more preferably −0.05 to 0 μm, from a reference plane at the boundary between the main surface and the chamfered surface.

According to the above-mentioned aspect 2, a mask blank is prepared by forming a thin film functioning as a transfer pattern on the main surface of the reticle substrate described in aspect 1. This can control deformation of the reticle and minimize a decrease in precision of a position of a transferred pattern, even if steppers have their respective substrate-holding members different in shape and the reticle prepared by using the mask blank is mounted on any one of the various shapes of the substrate-holding members which abut against the respective areas of the substrate.

According to the above-mentioned aspect 3, when the thin film has a film stress of 0.5 Gpa or less, the flatness of the substrate and the maximum height from a reference plane at the boundary between the main surface and chamfered surface in aspect 1 rarely change. Thus, the mask blank can maintain the surface shape of the substrate. Therefore, the flatness of the substrate and the maximum height from a reference plane at the boundary between the main surface and chamfered surface of the reticle prepared by using this mask blank rarely change. This can control deformation of the reticle and minimize a decrease in precision of a position of a transferred pattern when the reticle is mounted. Preferably, the film stress of the thin film is 0.2 Gpa or less, more preferably, 0.1 Gpa or less. When the main surface of the reticle substrate is provided with a plurality of thin films, the film stress means the total film stress of the plurality thin films. The film stress can be calculated from a difference in those of the substrate before and after the thin film is formed on the reticle substrate.

According to the above-mentioned aspect 4, specifically, a flatness-measuring area defined as an area of the main surface having a thin film of the mask blank excluding a peripheral area of a width of 3 mm inward from the boundary between the main surface and the chamfered surfaces has a flatness of 0.5 μm or less, and the maximum height from a reference plane at the boundary between the main surface and the chamfered surface is between −1 μm and 0 μm. This can certainly minimize a decrease in precision of a position of a transferred pattern.

According to the above-mentioned aspect 5, the flatness of the surface shape of the substrate is modified (or adjusted) by mechanical or mechanochemical polishing using a polishing pad unlike a conventional method performed by plasma etching. Consequently, as the surface roughness of the substrate is maintained or improved, the surface shape is modified (or adjusted) to a desired surface shape. This can control deformation of the reticle and minimize a decrease in precision of a position of a transferred pattern when the reticle is mounted on the substrate-holding means of the stepper. Thus, the reticle substrate according to aspect 1 can be manufactured with a high productivity and at a high yield rate.

According to aspect 5, the modifying of the shape can be performed by using a polishing apparatus which applies a plurality of pressing bodies as described below to almost the entire main surface of the substrate.

The surface shape (flatness) of the main surface of the substrate is preferably measured by a flatness-measuring apparatus utilizing optical interference in view of precision of the apparatus. The optical interference method utilizes that a difference in height of a surface of the substrate can be observed as a phase shift of a reflected light when the main surface of the substrate is irradiated with a coherent light such as a laser.

The above-mentioned grinding process is usually performed to achieve (1) the adjusting of the thickness of a sliced substrate to a predetermined one, (2) the uniformizing of a work distortion layer, and (3) the regulation of the flatness.

In the grinding process, generally, both faces of the reticle substrate held by a carrier are ground by rotating top and bottom tables and the carrier under the supplying of an abrasive grain liquid to both faces of the reticle substrate. Such double-side grinding is usually performed by two stages of rough grinding and precision grinding. For example, in the rough grinding, abrasive grain such as silicon carbide or alumina of about #400 to #600 is used, and in the precision grinding, abrasive grain such as alumina or zirconia of about #800 to 1500 is used.

The above-mentioned precision polishing process is usually performed to achieve mirror finish while the flatness obtained in the grinding process is maintained or improved.

In the precision polishing process, generally, both faces of the reticle substrate held by a carrier are polished by rotating the carrier and top and bottom tables on which polishing pads are adhered under the supplying of slurry containing abrasive grain to both faces of the reticle substrate. The polishing pads and slurry used in the double-side polishing are appropriately adjusted according to the substrate material, the surface shape to be prepared, and the surface roughness.

Examples of the polishing pads include a hard polishing pad such as a urethane pad, and a flexible polishing pad such as a suede-type pad.

The polishing liquid is comprised of at least one polishing abrasive selected from cerium oxide, ziconium oxide, aluminum oxide, colloidal silica, and the like; and a solvent selected from water, alkalis, and acids.

The abrasive having an average particle size of several tens nm to about 1 μm is used according to the surface roughness to be obtained.

According to the above-mentioned aspect 6, the precision polishing process is performed in multistage of a rough polishing process and a mirror-polishing process. The rough polishing process is for removing surface flaws of the substrate by using abrasive grain having a relatively large particle size, while maintaining the flatness obtained in the grinding process. The mirror-polishing process is for polishing the surface of the substrate for mirror finish by using abrasive grain having a relatively small particle size. Thus, the reticle substrate according to aspect 1 can be manufactured with a high productivity.

When the reticle substrate is made of glass, the polishing abrasive grain used in the rough polishing process is preferably cerium oxide having an average particle size of about 1 to 2 μm, and the polishing abrasive grain used in the mirror-polishing process is preferably colloidal silica having an average particle size of several tens to 100 nm.

According to the above-mentioned aspect 7, the mask blank according to aspect 2 can be manufactured by forming a thin film functioning as a transfer pattern on the main surface of the reticle substrate obtained by the method of manufacturing the reticle substrate according to aspect 5 or 6.

According to the above-mentioned aspect 8, the film stress of the thin film is decreased by performing a heating process during or after the forming of the thin film. Consequently, the flatness of the substrate and the maximum height from a reference plane at the boundary between the main surface and the chamfered surface rarely change. Thus, the mask blank maintaining the surface shape of the substrate can be manufactured.

Materials and sizes of the reticle substrate according to the present invention do not have any limitation.

As the material of the reticle substrate, any material can be used as long as the material is transparent against the exposure light of the exposure apparatus. Typical material is glass. Examples of the glass include synthetic quartz glass, soda lime glass, aluminosilicate glass, aluminoborosilicate glass, non-alkali glass, and crystallized glass.

In general, the size of the reticle substrate is 6025 size (152.4×152.4×6.35 mm) or 5009 size (127×127×2.29 mm), but is not limited to these sizes.

The thin film functioning as a transfer pattern according to the present invention causes an optical change of the exposure light used when the pattern is transferred. Examples of the thin film include the light-shielding film and a phase-shift film.

In the mask blank, a resist film may be formed on the thin film functioning as the transfer pattern.

The reticle substrate and the mask blank according to the present invention can control deformation of the reticle and minimize a decrease in precision of a position of a transfer pattern when the reticle is mounted on the substrate-holding means of the stepper.

According to the method for manufacturing the reticle substrate and mask blank of the present invention, a reticle substrate can be manufactured with a high productivity and at a high yield rate. The reticle substrate can control deformation of the reticle and minimize a decrease in precision of a position of a transfer pattern when the reticle is mounted on the substrate-holding means of the stepper.

BEST MODE FOR CARRYING OUT THE INVENTION

EXAMPLE 1

Figure 1:
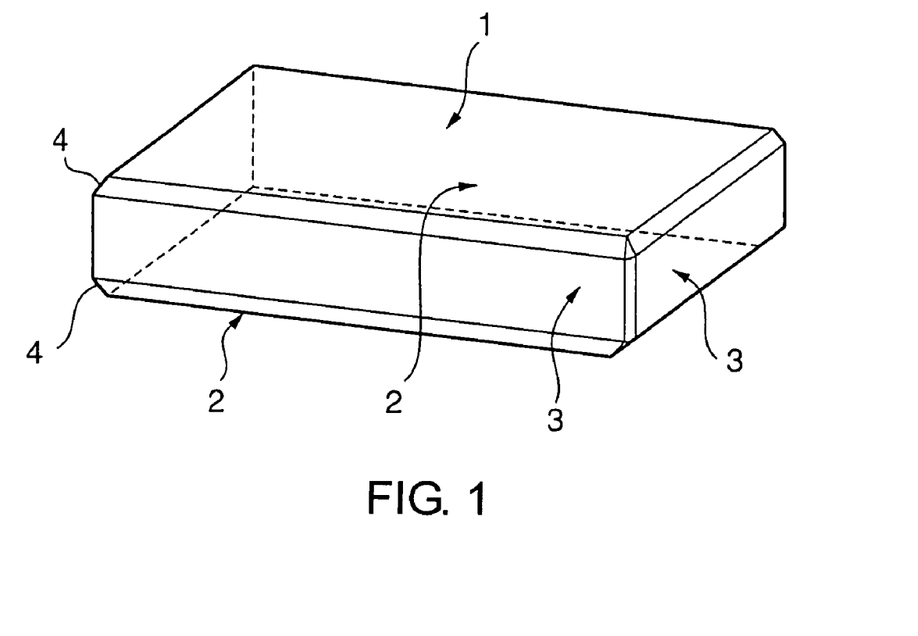
FIG. 1 is an overall view of a reticle substrate according to the present invention.

With reference to FIG. 1, a reticle substrate 1 used in this Example was a square-shaped substrate having a pair of main surfaces 2 opposing each other, two pairs of side faces 3 right to the main surfaces 2, and chamfered surfaces 4 intervening between the main surfaces 2 and the side faces 3. The substrate was made of a synthetic quartz glass having 6025 size of 152.4×152.4×6.35 mm.

A flatness-measuring area was defined as an area of a main surface excluding a peripheral area of a width of 3 mm inward from each boundary between the main surface 2 and the chamfered surfaces 4. The flatness-measuring area had a flatness of 0.22 μm. When the area of the main surface surrounded by a line at 3 mm and a line at 16 mm inward from the boundary between the main surface and the chamfered surfaces was defined as a virtual reference plane (0), the end shape had the maximum height of −0.5 μm at the boundaries between the main surface and the chamfered surfaces.

The above-mentioned flatness value was measured by an optical interference-type flatness-measuring apparatus (FM-200: Tropel Corp.), and the end shape was measured by a stylus-type roughness-measuring apparatus (SURFTEST-501: Mitutoyo Corp.).

Then, a substrate deformation-testing apparatus for vacuum chucking of two sides of the substrate as in the substrate-holding members of the stepper shown in FIG. 2 was prepared for conducting the deformation test of the substrate. The reticle substrate according to the present invention was held by vacuum chucking, and a change in flatness was measured by an optical interference system (Zygo Mark GPI) to be 0.1 μm or less. Thus, deformation of the substrate was not almost observed.

A light-shielding film was formed on this reticle substrate by sputtering. The light-shielding film was a laminated film composed of CrN/CrC/CrON, and the laminated film contained helium (He). Then, the substrate was heated at 120° C. for a predetermined time to prepare a mask blank. The flatness of the resulting mask blank was measured at the above-defined flatness-measuring area. The film stress of the light-shielding film was calculated from the difference in the flatness of the substrate before and after the forming of the light-shielding film to confirm a stress of 0.1 Gpa or less, i.e. almost 0 Gpa. The maximum height at the boundary between the main surface and the chamfered surface was −0.5 μm. Thus, the end shape of the substrate at the side having the light-shielding film was the same as that before the light-shielding film was formed.

The reticle, the substrate having the light-shielding film pattern, is prepared by using this mask blank. The pattern position had a satisfactory precision expected when an $F_2$ excimer laser exposure light source (exposure wavelength: 157 nm) was used, even if steppers had their respective substrate-holding members different in shape and the reticle was mounted on any one of the various shapes of the substrate-holding members which abut against the respective areas of the substrate.

A method for manufacturing the reticle substrate will now be described.

The method for manufacturing the reticle substrate according to the present invention includes a grinding process that prepares a reticle substrate having edges chamfered surface at a predetermined size and that grinds both main surfaces of the substrate; a rough polishing process that removes surface flaws or defects of the substrate while maintaining the flatness obtained in the grinding process; a mirror-polishing process that polishes the surfaces of the substrate for mirror finish; a surface shape-measuring process that measures the surface shape of one main surface of the mirror-polished substrate; and a shape-modifying process that modifies the surface shape of the substrate by partially modifying the shape of the surface according to the measured data so that the substrate has a desired surface shape. The method includes washing processes between the grinding process and the rough polishing process, between the rough polishing process and the mirror-polishing process, between the mirror-polishing process and the shape-modifying process, and after the shape-modifying process.

A polishing apparatus used in the shape-modifying process will now be described.

Figure 4:
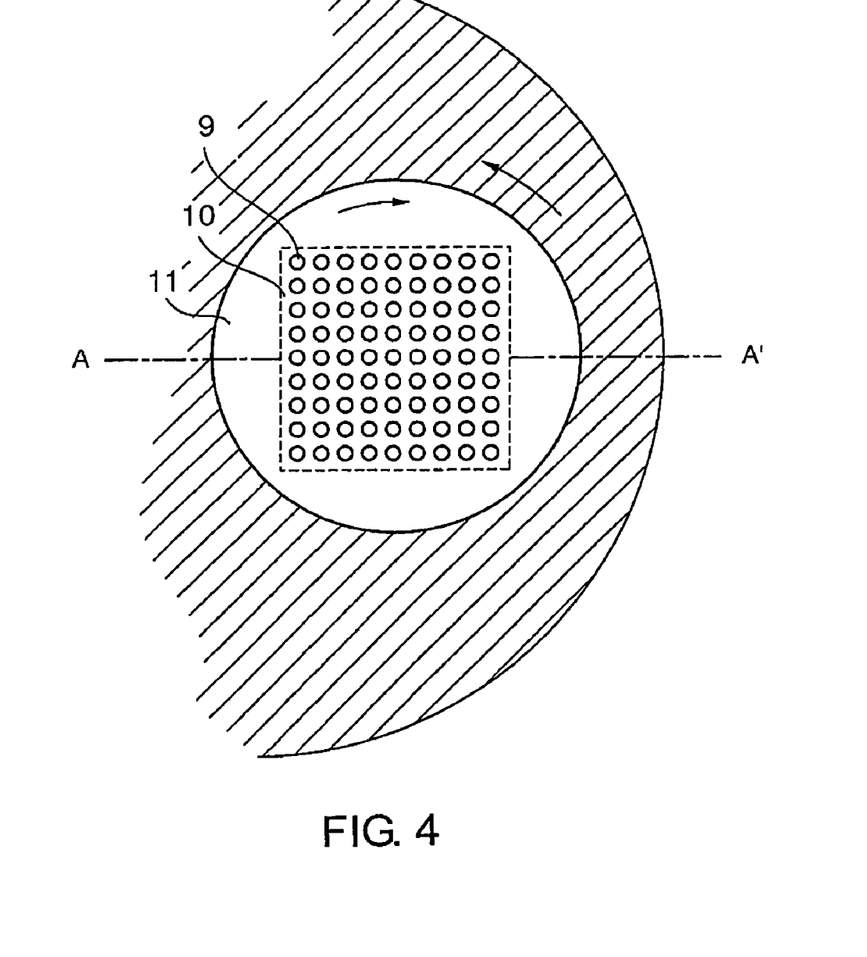
FIG. 4 is a plan view of a substrate-polishing apparatus used in the present invention.
Figure 5:
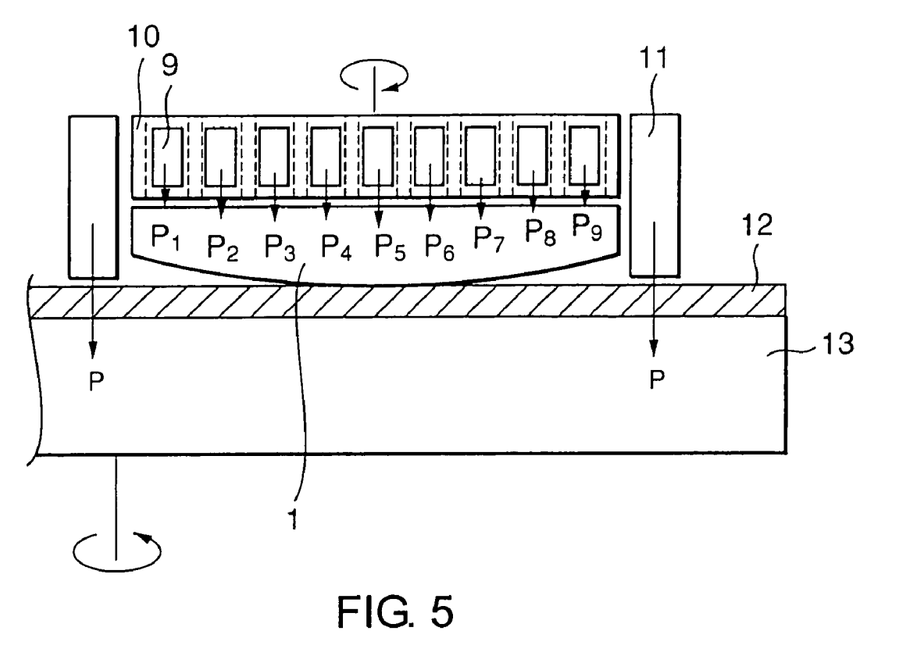
FIG. 5 is a cross-sectional view of a substrate-polishing apparatus used in the present invention.

FIG. 4 is a plan view of a mechanism of a polishing apparatus used for modifying the surface shape of the reticle substrate according to the present invention. FIG. 5 is a cross-sectional view taken along the line A-A' of FIG. 4.

With FIGS. 4 and 5, the reticle substrate is prepared by the grinding process and a precision polishing process. The reticle substrate is held on a polishing table with a retainer ring 11, and is rotated under being pressed against the polishing table 13 by pressing bodies 9. The retainer ring 11 serves to make the pressure applied to the periphery of the substrate uniform by holding down the polishing pad 12. The polishing pad 12 is adhered on the polishing table 13. The main surface of the substrate is polished by rotating the pressing bodies 9 in the opposite direction of the rotation of the polishing table under pressing the substrate against the polishing pad. A large number of the pressing bodies 9 are provided so as to cover the top surface of the substrate, and are held by a pressing bodies-holding means 10. Therefore, the pressure applied to the substrate can be partially controlled. The pressing bodies 9 are driven by an air cylinder.

For example, when the reticle substrate after the precision polishing process has a concave shape of a flatness of 0.25 μm at a flatness-measuring area defined as an area of the main surface excluding a peripheral area of a width of 3 mm inward from the boundary between the main surface of the substrate and the chamfered surfaces and the end shape curves upward and has the maximum height of 1 μm, loads are applied only to the pressing bodies of the polishing apparatus placed at the peripheries of the substrate so that the pressure is applied to only the peripheries of the reticle substrate. Thus, a flagging end shape of −0.5 to 0 μm can be readily obtained by modifying only the end shape.

When the reticle substrate after the precision polishing process had a convex shape of a flatness of 1 μm at the flatness-measuring area and a flagging end shape of the maximum height of 1 μm, the surface shape of the flatness-measuring area and the periphery of the substrate must be modified. The reticle substrate having a flatness of 0.5 μm or less and an end shape of the maximum height of −0.5 to 0 μm can be readily obtained by applying larger loads to the pressing bodies positioned at the central part of the substrate than that to the pressing bodies positioned at the peripheries of the substrate.

Grinding Process

The grinding process was performed by grinding both faces by using alumina abrasive grain of #400 and alumina abrasive grain of #800 as abrasive grain.

Rough Polishing Process

The rough polishing process was performed by polishing both faces by using a polishing pad of foamed polyurethane and cerium oxide having an average particle size of about 1 to 2 μm.

Mirror-polishing Process

The mirror-polishing process was performed by polishing both faces by using a flexible suede-type polishing pad and colloidal silica having an average particle size of about 100 nm.

The substrate was washed with a low concentration hydrofluoric acid solution after each process.

Surface Shape-measuring Process

A flatness-measuring area defined as an area of the main surface excluding a peripheral area of a width of 3 mm inward from the boundary between the main surface and the chamfered surfaces of the substrate had a concave shape of a flatness of 0.5 µm. The end shape had the maximum height of 1 µm at the boundary between the main surface and the chamfered surface. The root-mean-square surface roughness (RMS roughness) of the main surface of the substrate measured with an atomic force microscope was favorably 0.15 nm.

Shape-modifying Process

The periphery of the substrate was preferentially polished to form an end shape having a decline, and the flatness of the substrate at the central part excepting the periphery of the substrate was further improved by applying a load of 0.5 kg/cm$^2$ to the pressuring bodies positioned at the periphery of the substrate and applying a load of 0.1 to 0.2 kg/cm$^2$ to the pressuring bodies positioned at the central part of the substrate. Thus, the shape was modified. Slurry containing colloidal silica abrasive grain having an average particle size of about 100 nm was used as a polishing liquid. The processing was continued till the end shape has the maximum height of −0.5 to 0 µm. Then, the substrate was washed with a low concentration hydrofluoric acid solution to obtain the reticle substrate.

As a result, a flatness-measuring area defined as an area of the main surface excluding a peripheral area of a width of 3 mm inward from the boundary between the main surface and the chamfered surfaces of the substrate had a flatness of 0.22 µm. The end shape had the maximum height of −0.5 µm at the boundary between the main surface and the chamfered surface.

A hundred reticle substrates were manufactured according to the above-mentioned EXAMPLE. Each of the hundred reticle substrates had a flatness of 0.5 µm or less at the flatness-measuring area defined as an area of the main surface excluding a peripheral area of a width of 3 mm inward from the boundary between the main surface and the chamfered surfaces of the substrate. The maximum height from the reference plane was −0.5 to 0 µm at the boundary between the main surface and the chamfered surface. The change amount of the flatness did not exceed 0.1 µm, and no deformation of the substrate was observed.

Light-shielding films were formed on the reticle substrates by sputtering. Each light-shielding film was a laminated film composed of CrN/CrC/CrON, and the laminated film contained helium (He). Then, the substrates were heated at 120° C. for a predetermined time to prepare mask blanks. The flatness of each resulting mask blank was measured at the above-defined flatness-measuring area. The film stress of each light-shielding film was calculated from the difference in the flatness of the substrate before and after the forming of the light-shielding film, and a stress of 0.1 Gpa or less, i.e. almost 0 Gpa was confirmed. The end shape of each substrate at the side having the light-shielding film had the maximum height of −0.5 µm at the boundary between the main surface and the chamfered surface. Thus, the end shapes were the same as those before the light-shielding films were formed.

Reticles, the substrates on which light-shielding film patterns were formed, were prepared by using these mask blanks. Each pattern position had a satisfactory precision expected when an F$_2$ excimer laser exposure light source (exposure wavelength: 157 nm) was used, even if steppers had their respective substrate-holding members different in shape and the reticle was mounted on any one of the various shapes of the substrate-holding members which abut against the respective areas of the substrate.

EXAMPLE 2

A reticle substrate having a flatness of 0.5 µm at the flatness-measuring area defined as an area of the main surface excluding a peripheral area of a width of 3 mm inward from the boundary between the main surface and the chamfered surfaces of the substrate and having the maximum height of −0.82 µm from a reference plane at the boundary between the flatness-measuring area and the peripheral area was prepared by a method similar to that in the EXAMPLE 1 under appropriately adjusted processing conditions.

The change in the flatness defined as in EXAMPLE 1 was measured to confirm a flatness change of 0.1 µm or less. Thus, no deformation of the substrate was observed.

A mask blank was prepared by forming a light-shielding film on the reticle substrate by sputtering. The light-shielding film was a laminated film composed of CrN/CrC/CrON, and the laminated film contained helium (He). The flatness at the above-defined flatness-measuring area was measured. The film stress of the light-shielding film was calculated from the difference in the flatness of the substrate before and after the forming of the light-shielding film to confirm a stress of 0.45 Gpa. The end shape of the substrate at the side where the light-shielding film was formed had the maximum height of −0.86 µm at the boundary between the main surface and the chamfered surface. The maximum height changed by 0.04 µm.

A reticle, the substrate on which a light-shielding film pattern was formed, was prepared by using this mask blank. The pattern position had a satisfactory precision expected when an ArF excimer laser exposure light source (exposure wavelength: 193 nm) was used, even if steppers had their respective substrate-holding members different in shape and the reticle was mounted on any one of the various shapes of the substrate-holding members which abut against the respective areas of the substrate.

EXAMPLE 3

An MoSiN halftone film was formed on the reticle substrate of EXAMPLE 1 by sputtering, and the substrate was heated at 120° C. for a predetermined time. Then, a light-shielding film made of a CrN/CrC/CrON laminated film was formed on the MoSiN halftone film by sputtering to prepare a halftone-type phase-shift mask blank. The flatness of the resulting mask blank was measured at the above-defined flatness-measuring area. The film stress of the halftone film/light-shielding film was calculated from the difference in the flatness of the substrate before and after the forming of the film to confirm a stress of 0.2 Gpa. The end shape of the substrate at the side where the halftone film and the light-shielding film were formed had the maximum height of −0.82 µm at the boundary between the main surface and the chamfered surface. Thus, the maximum height was the same as that of the reticle substrate before the films were formed.

A reticle, the substrate on which a halftone film pattern was formed, was prepared by using this halftone-type phase-shift mask blank. The pattern position had a satisfactory precision expected when an ArF excimer laser exposure light source (exposure wavelength: 193 nm) was used, even if steppers had their respective substrate-holding members different in shape and the reticle was mounted on any one of the various shapes of the substrate-holding members which abut against the respective areas of the substrate.

COMPARATIVE EXAMPLE

A reticle substrate was prepared by the same method as in the above-described EXAMPLES except the shape-modifying process. The shape-modifying method of the shape-modifying process was performed by partial plasma etching based on the measured data in the surface shape-measuring process and mechanical polishing for a very short time in order to decrease the surface roughness of the glass substrate caused by the plasma etching.

As a result, the flatness at the flatness-measuring area defined as an area of the main surface excluding a peripheral area of a width of 3 mm inward from the boundary between the main surface and the chamfered surfaces of the substrate was favorably 0.25 µm, but the end face had the maximum height of −1.5 µm at the boundary between the main surface and the chamfered surface.

Then, a deformation test of the substrate was performed as in above. The change in the flatness by vacuum chucking was 0.5 µm. Thus, the deformation of the substrate occurred.

A mask blank was prepared by forming a light-shielding film of a laminated film composed of CrN/CrC/CrON on the reticle substrate by sputtering. Then, a reticle, the substrate on which a light-shielding film pattern was formed, was prepared by using this mask blank. The pattern position did not satisfy the precision expected when an $F_2$ excimer laser (exposure wavelength: 157 nm) or an ArF excimer laser (exposure wavelength: 193 nm) exposure light source was used, when the steppers had their respective substrate-holding members different in shape and the reticle was mounted on any one of the various shapes of the substrate-holding members which will abut against the respective areas of the substrate.

A hundred reticle substrates were manufactured according to the above-mentioned COMPARATIVE EXAMPLE. Only 74 of the 100 reticle substrates had a flatness of 0.5 µm or less at the flatness-measuring area defined as an area of the main surface excluding a peripheral area of a width of 3 mm inward from the boundary between the main surface and the chamfered surfaces of the substrate and the maximum height of −0.5 to 0 µm from a reference plane at the boundary between the main surface and the chamfered surface. This is caused by that the flagging in the end shape is increased by mechanical polishing for a very short time which was conducted for decreasing the surface roughness of the glass substrate caused by the plasma etching, and caused by difficulties in precise measurement of the peripheral shape of the substrate.

INDUSTRIAL APPLICABILITY

Deformation of a substrate at the periphery can be decreased by applying the present invention to a reticle having a pattern-formed thin film, to a substrate for a mask blank before the forming of a pattern, and to a method manufacturing a reticle or a substrate.

The invention claimed is:
1. A reticle substrate comprising a pair of main surfaces opposing each other, two pairs of side faces that are right to the main surfaces and that are opposed in pair to each other, and chamfered surfaces between the main surfaces and the side faces, wherein:
at least one of the main surfaces has a flatness not greater than 0.5 µm on a flatness measuring area which is laid inside of an intermediate area of 3 mm located within a boundary between the at least one main surface and the chamfered surface;
the boundary between the at least one main surface and the chamfered surface has a maximum height between −1 and 0 µm (excluding 0 µm) from a reference surface determined in relation to the flatness measuring area disposed inside of the intermediate area; and
the intermediate area between the flatness measuring area and the chamfered surface is declined or lowered from the flatness measuring area towards the chamfered surface.

2. A mask blank comprising a thin film for a transfer pattern, on the at least one of the main surfaces of the reticle substrate according to claim 1.

3. The mask blank according to claim 2, wherein the thin film has a film stress of 0.5 Gpa or less.

4. The mask blank according to claim 2 or 3, wherein the flatness is not greater than 0.5 µm on a flatness measuring area of the main surface on which the thin film is formed, with the intermediate area of 3 mm which is laid inwardly from the boundary between the main surface and the chamfered surface and which is exempted from the flatness measuring area, while the boundary between the main surface and the chamfered surface has the maximum height between −1 and 0 µm from the reference surface determined in relation to the flatness measuring area laid inside of the intermediate area; and
wherein:
the intermediate area between the flatness measuring area and the chamfered surface is lowered from the flatness measuring area towards the chamfered surface.

5. A method for manufacturing the reticle substrate according to claim 1, characterized by the steps of:
grinding and precisely polishing a main surface of a reticle substrate;
thereafter measuring a surface configuration of the main surface on an area that includes a substrate peripheral portion to be supported by a substrate-holding member of an exposure apparatus; and
modifying the surface configuration of the main surface on the basis of a result of the measurement so that the surface configuration of the main surface becomes a desired shape, by finding that an area of the main surface is convex relative to an optionally determined reference plane, by providing, on the area, a pressure higher than the other areas onto polishing pads of a polishing apparatus, with a polishing liquid being supplied towards the polishing pads, and by moving the reticle substrate relative to the polishing pads.

6. The method for manufacturing the reticle substrate according to claim 5, wherein the above-mentioned precisely polishing step comprises:
a roughly polishing process of removing surface defects of the substrate while maintaining the flatness obtained in the grinding process by using a relatively large abrasive grain; and
a mirror-polishing process of polishing the surface of the substrate for mirror finish by using a relatively small abrasive grain.

7. A method for manufacturing the mask blank by forming a thin film as a transfer pattern on a main surface of the reticle substrate manufactured by the method according to claim 5 or 6.

8. The method for manufacturing the mask blank according to claim 7, comprising:
a heating process of suppressing that change of the maximum height from the reference plane which appears during or after the forming of the thin film, at the boundary between the main surface and the chamfered surface, the heating process being carried out before and after the forming of the thin film.

9. A reticle substrate comprising a pair of main surfaces opposing each other, two pairs of side faces right to the main surfaces wherein the two side faces of each pair opposing each other, and chamfered surfaces between the main surfaces and the side faces, wherein:

at least one of the main surfaces has a flatness not greater than 0.5 μm on a flatness measuring area which is laid inside of an intermediate area of 3 mm located within a boundary between the main surface and the chamfered surface;

while a boundary between the flatness-measuring area and a flatness non-measuring area has a maximum height between −1 and 0 μm from a reference surface determined in relation to the flatness measuring area laid inside of the intermediate area; and wherein:

the intermediate area between the flatness measuring area and the chamfered surface is lowered from the flatness measuring area towards the chamfered surface.

10. A mask blank comprising a thin film functioning as a transfer pattern formed on at least one of the main surfaces of the reticle substrate according to claim 9.

11. The mask blank according to claim 10, wherein the thin film has a film stress of 0.5 Gpa or less.

12. The mask blank according to claim 10 or 11, wherein the flatness is not greater than 0.5 μm on a flatness measuring area of the main surface on which the thin film is formed, with the intermediate area of 3 mm which is laid inwardly from the boundary between the main surface and the chamfered surface and which is exempted from the flatness measuring area, while the boundary between the flatness measuring area and the flatness non-measuring area has the maximum height between −1 and 0 μm from the reference surface determined in relation to the flatness measuring area laid inside of the intermediate area; and wherein:

the intermediate area between the flatness measuring area and the chamfered surface is lowered from the flatness measuring area towards the chamfered surface.

13. A method for manufacturing the reticle substrate according to claim 9, characterized by the steps of:

grinding and precisely polishing a main surface of a reticle substrate;

thereafter measuring a surface configuration of the main surface on an area that includes a substrate peripheral portion to be supported by a substrate-holding member of an exposure apparatus; and modifying the surface configuration of the main surface on the basis of a result of the measurement so that the surface configuration of the main surface becomes a desired shape, by finding that an area of the main surface is convex relative to an optionally determined reference plane, by providing, on the area, a pressure higher than the other areas onto polishing pads of a polishing apparatus, with a polishing liquid being supplied towards the polishing pads, and by moving the reticle substrate relative to the polishing pads.

14. The method for manufacturing the reticle substrate according to claim 13, wherein the above-mentioned precisely polishing step comprises:

a roughly polishing process of removing surface defects of the substrate while maintaining the flatness obtained in the grinding process by using a relatively large abrasive grain; and a mirror-polishing process of polishing the surface of the substrate for mirror finish by using a relatively small abrasive grain.

15. A method for manufacturing the mask blank by forming a thin film as a transfer pattern on a main surface of the reticle substrate manufactured by the method according to claim 13 or 14.

16. The method for manufacturing the mask blank according to claim 15, comprising:

a heating process of suppressing that change of the maximum height from the reference plane which appears during or after the forming of the thin film, at the boundary between the main surface and the chamfered surface, the heating process being carried out before and after the forming of the thin film.

17. The reticle substrate according to claim 1, wherein:

the flatness measuring area has a flatness not greater than 0.25 μm while the boundary between the main surface and the chamfered area has a maximum height between −0.5 μm and 0 μm relative to the reference surface.

18. The reticle substrate according to claim 9, wherein:

the flatness measuring area has a flatness not greater than 0.25 μm while a boundary between the flatness measuring area and the flatness non-measuring area has a maximum height between −0.5 μm and 0 μm relative to the reference surface.

19. The method for manufacturing the reticle substrate according to claim 5, wherein the modifying step is carried out so that a desired relationship could be accomplished between a flatness of the flatness measuring area and a declined degree of the intermediate between the flatness measuring area and the chamfered area.

20. The method for manufacturing the reticle substrate according to claim 13, wherein the modifying step is carried out so that a desired relationship could be accomplished between a flatness of the flatness measuring area and a declined degree of the intermediate between the flatness measuring area and the chamfered area.

* * * * *